(12) United States Patent
Lin et al.

(10) Patent No.: US 8,746,173 B2
(45) Date of Patent: Jun. 10, 2014

(54) PLASMA DEPOSITION DEVICE

(75) Inventors: I-Nan Lin, New Taipei (TW); Ton-Rong Tseng, New Taipei (TW)

(73) Assignees: I-Nan Lin, New Taipei (TW); Mastek Technologies, New Taipei (TW)

( * ) Notice: Subject to any disclaimer, the term of this patent is extended or adjusted under 35 U.S.C. 154(b) by 495 days.

(21) Appl. No.: 13/191,196

(22) Filed: Jul. 26, 2011

(65) Prior Publication Data

US 2012/0152169 A1    Jun. 21, 2012

(30) Foreign Application Priority Data

Dec. 15, 2010   (TW) ................................ 99143951 A

(51) Int. Cl.
*C23C 16/511*    (2006.01)

(52) U.S. Cl.
USPC .... 118/723 MW; 118/723 AN; 118/723 ME; 156/345.41; 156/345.35; 156/345.36

(58) Field of Classification Search
USPC .................. 118/723 MW, 723 ME, 723 AN; 156/345.41, 345.35, 345.36
See application file for complete search history.

(56) References Cited

U.S. PATENT DOCUMENTS

| 4,611,108 | A | * | 9/1986 | Leprince et al. | .......... 219/121.48 |
| 5,522,936 | A | * | 6/1996 | Tamura | ..................... 118/723 R |
| 2010/0201272 | A1 | * | 8/2010 | Lee | .......................... 315/111.21 |

* cited by examiner

*Primary Examiner* — Jeffrie R Lund
*Assistant Examiner* — Satish Chandra
(74) *Attorney, Agent, or Firm* — Pearl Cohen Zedek Latzer Baratz LLP

(57) ABSTRACT

A plasma deposition device for coating a substrate includes: a vacuum chamber; a waveguide disposed in the vacuum chamber for transmitting a microwave; an antenna unit disposed in the vacuum chamber above the substrate for receiving the microwave from the waveguide, and connected to the waveguide, the antenna unit including an outer conductor and an inner conductor wire that is disposed inside the outer conductor; a gas supplying conduit disposed inside the outer conductor and surrounding the inner conductor wire, and including a plurality of exhaust holes for blowing a plasma-inducing gas downward and toward the substrate to interact with the microwave and to produce plasma; and a blocking unit disposed in the vacuum chamber to prevent the plasma-inducing gas blown to the substrate from flowing back to the gas supplying conduit.

8 Claims, 14 Drawing Sheets

PLASMA DEPOSITION DEVICE

CROSS-REFERENCE TO RELATED APPLICATION

This application claims priority of Taiwanese application no. 099143951, filed on Dec. 15, 2010.

BACKGROUND OF THE INVENTION

1. Field of the Invention

This invention relates to a plasma deposition device, more particularly to a plasma deposition device that can produce plasma evenly.

2. Description of the Related Art

With the rapid growth of high-tech industry, a plasma enhanced chemical vapor deposition (PECVD) technology has gained much attention and is widely applied, especially in the field of semiconductor fabrication. For example, in a process for forming a polysilicon film in a thin film transistor liquid crystal display (TFT-LCD), or in a process for forming a wafer substrate and a solar energy plate in a solar cell, it is necessary to use a PECVD device.

However, PECVD may have the following problem. After a silicon film forming-material, such as silane ($SiH_4$), reacts with the plasma to release silicon ions used to form a silicon film on a substrate, the silicon film is not only formed on the substrate, but also accumulates on a gas supplying conduit, clogging transmission of microwave. When accumulation is serious, no plasma will be generated, and replacement of the gas supplying conduit needs to be conducted. This will increase the cost for processing a semiconductor film.

SUMMARY OF THE INVENTION

Therefore, an object of the present invention is to provide a plasma deposition device that can overcome the aforesaid drawbacks associated with the prior art.

Accordingly, a plasma deposition device for coating a substrate of this invention comprises:

a vacuum chamber;

a waveguide disposed in the vacuum chamber for transmitting a microwave;

an antenna unit disposed in the vacuum chamber above the substrate for receiving the microwave from the waveguide, and connected to the waveguide, the antenna unit including an outer conductor and an inner conductor wire that is disposed inside the outer conductor;

a gas supplying conduit disposed inside the outer conductor and surrounding the inner conductor wire, and including a plurality of exhaust holes for blowing a plasma-inducing gas downward and toward the substrate to interact with the microwave and to produce plasma; and a blocking unit disposed in the vacuum chamber to prevent the plasma-inducing gas blown to the substrate from flowing back to the gas supplying conduit.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
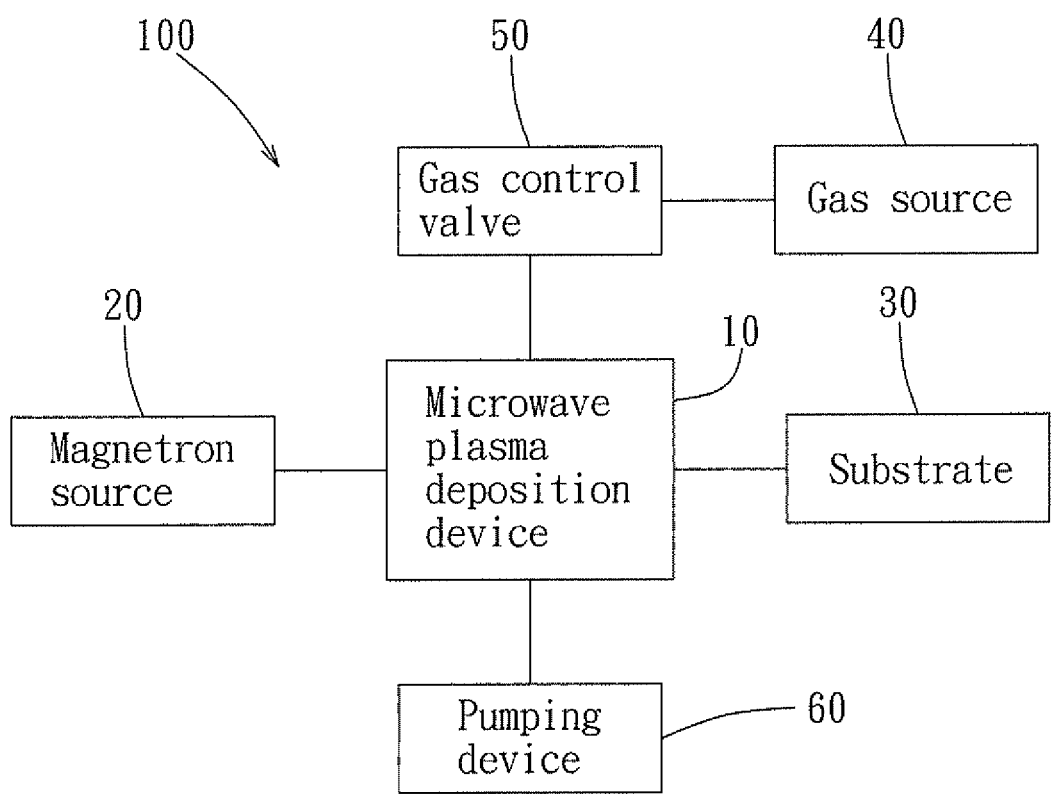
FIG. 1 is a block diagram illustrating the first preferred embodiment of the plasma deposition device according to this invention.

Before the present invention is described in greater detail with reference to the accompanying preferred embodiments, it should be noted herein that like elements are denoted by the same reference numerals throughout the disclosure.

Referring to FIG. 1, the first preferred embodiment of a plasma film-forming apparatus 100 employs a linear microwave plasma system, and includes a magnetron source 20 for generating a microwave of 2.45 GHz, a microwave plasma deposition device 10 connected to the magnetron source 20 and used to coat a film onto a substrate 30, a gas source 40 for providing a plasma-inducing gas to the microwave plasma deposition device 10, a gas control valve 50 disposed between the microwave plasma deposition device 10 and the gas source 40 for controlling the amount of the plasma-inducing gas supplied to the microwave plasma deposition device 10, and a pumping device 60 connected to the microwave plasma deposition device 10 for controlling a pressure inside the microwave plasma deposition device 10. In this embodiment, the plasma-inducing gas includes argon.

Figure 2:
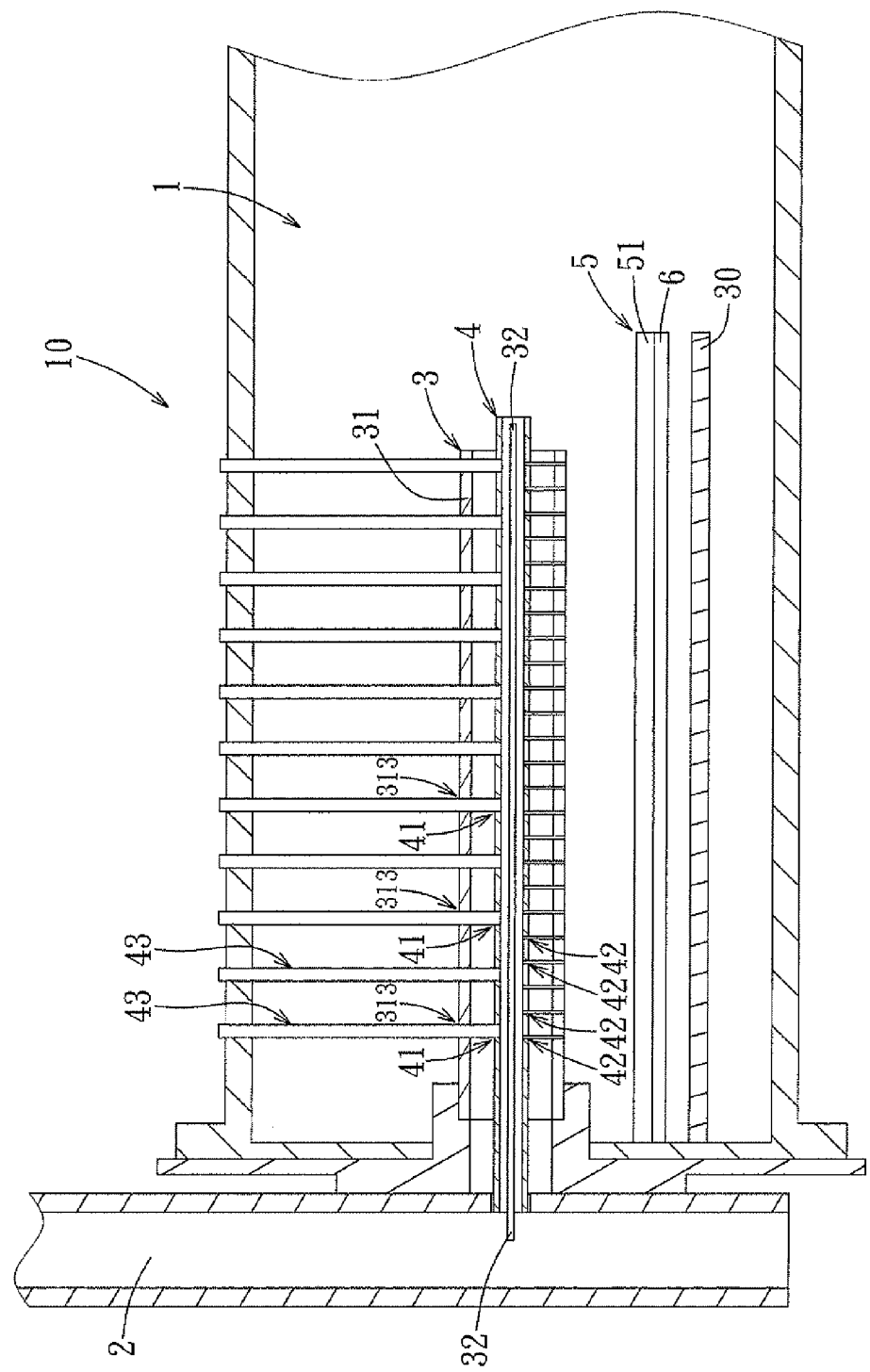
FIG. 2 is a fragmentary cross-sectional view illustrating a relationship among a waveguide, a gas supplying conduit, an antenna unit, and a substrate in a vacuum chamber of the plasma deposition device according to the first preferred embodiment of this invention.

Referring to FIG. 2, the microwave plasma deposition device 10 includes a vacuum chamber 1, a waveguide 2, an antenna unit 3, a gas supplying conduit 4, and a blocking unit 5.

The vacuum chamber 1 is vacuumed inside, the pressure of which is preferably controlled at 5~500 torr using the pumping device 60. The waveguide 2 is disposed in the vacuum chamber 1 and is connected to the magnetron source 20 for transmitting a microwave generated from the magnetron source 20 to the antenna unit 3. The antenna unit 3 is disposed in the vacuum chamber 1 above the substrate 30 for receiving the microwave from the waveguide 2, and is connected to the waveguide 2. The gas supplying conduit 4 is disposed inside the antenna unit 3, and is a cylindrical hollow quartz tube. The gas supplying conduit 4 includes a plurality of intake holes 41 and a plurality of exhaust holes 42. The intake holes 41 and the exhaust holes 42 are respectively formed on two opposite sides of the gas supply conduit 4. The plasma-inducing gas (i.e., argon) from the gas source 40 is introduced into the gas supplying conduit 4 through the intake holes 41. The exhaust holes 42 are used for blowing the plasma-inducing gas into the vacuum chamber 1. In this embodiment, the diameter of each of the intake holes 41 is relatively large (6 mm), and the diameter of each of the exhaust holes 42 is relatively small (1 mm). With the design of the intake holes 41 and the exhaust holes 42, the pressure inside the gas supplying conduit 4 can be maintained at a relatively high value, and the pressure outside of the gas supplying conduit 4 does not increase in a great degree. Thus, the flow rate of the plasma-inducing gas (argon) can be increased.

Figure 3:
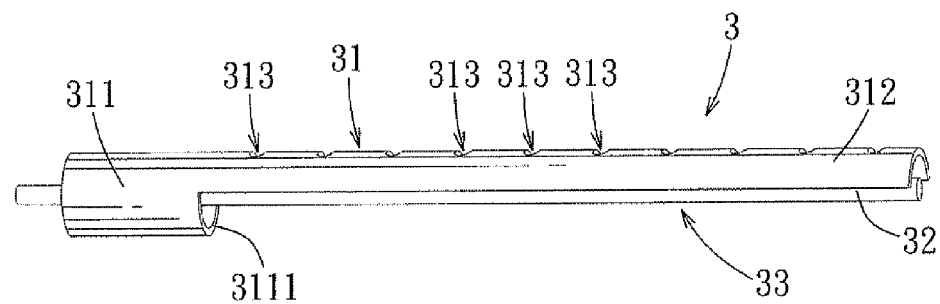
FIG. 3 is a schematic view of the antenna unit of FIG. 2.

Referring to FIGS. 2 and 3, the antenna unit 3 includes an outer conductor 31 surrounding the gas supplying conduit 4, and an inner conductor wire 32 that is disposed centrally inside the outer conductor 31 and the gas supplying conduit 4. The gas supplying conduit 4 is disposed inside the outer conductor 31 and surrounds the inner conductor wire 32. The outer conductor 31 is hollow inside, and includes a connection portion 311 connected to the waveguide 2, and a wave-transmitting portion 312 extending from one end 3111 of the connection portion 311 opposite to the waveguide 2. The wave-transmitting portion 312 includes a plurality of bores 313 for extension of pipes 43 that are used for introducing the plasma-inducing gas into the gas supplying conduit 4 through the intake holes 41. Thus, the number and position of the bores 313 corresponds to those of the intake holes 41. The wave-transmitting portion 312 has an arc-shaped cross section and an opening 33 that opens downward in the same direction as the exhaust holes 42 and that is as long as the wave-transmitting portion 312. The arc-shaped cross section of the wave-transmitting portion 312 has a constant dimension. An opening angle of the opening 33 is defined by an angle subtended by the opening 33 at the center of the wave-transmitting portion 312. The opening 33 is symmetrical with respect to a line of shortest distance between the inner conductor wire 32 and the substrate 30. The inner conductor wire 32 is a coaxial line. One end of the inner conductor wire 32 is disposed inside the waveguide 2 for guiding the microwave outward. Thus, the antenna unit 3 is able to receive the microwave from the waveguide 2 and to emit the microwave through the opening 33.

Figure 4:
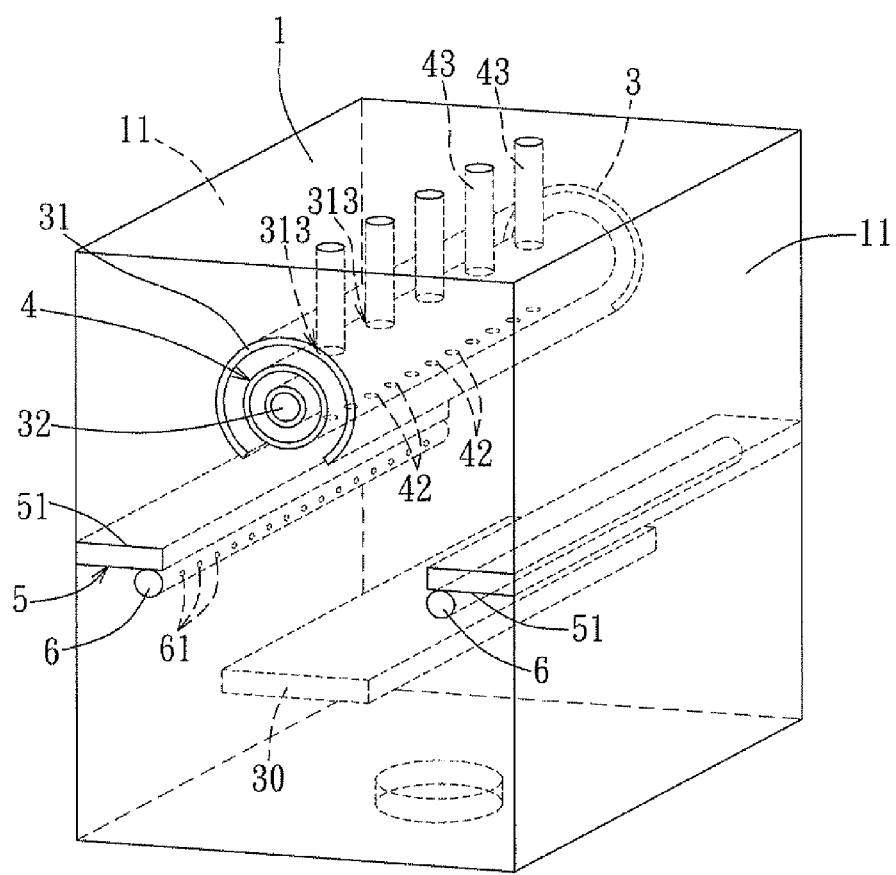
FIG. 4 is a perspective view illustrating a positional relationship among the gas supplying conduit, the substrate, and two blocking plates according to the first preferred embodiment of this invention.

Referring to FIG. 4, the substrate 30 is disposed to face the opening 33 of the wave-transmitting portion 312 and the exhaust holes 42. Thus, the exhaust holes 42 are used for blowing the plasma-inducing gas (argon) downward and toward the substrate 30 to interact with the microwave emitted via the opening 33 and to produce plasma.

The blocking unit 5 is disposed in the vacuum chamber to prevent the plasma-inducing gas blown to the substrate 30 from flowing back to the gas supplying conduit 4. In this preferred embodiment, the vacuum chamber 1 has two opposite sidewalls 11, and the gas supplying conduit 4 is located substantially midway between the sidewalls 11 and above the substrate 30 (see FIG. 4). The blocking unit 5 includes two blocking plates 51 mounted respectively on the sidewalls 11 below the gas supplying conduit 4 and above the substrate 30, and is located on two opposite sides of a downward flowing path of the plasma. The blocking plates 51 can be mounted on the sidewalls 11 such as by using adhesive or fasteners.

Figure 5:
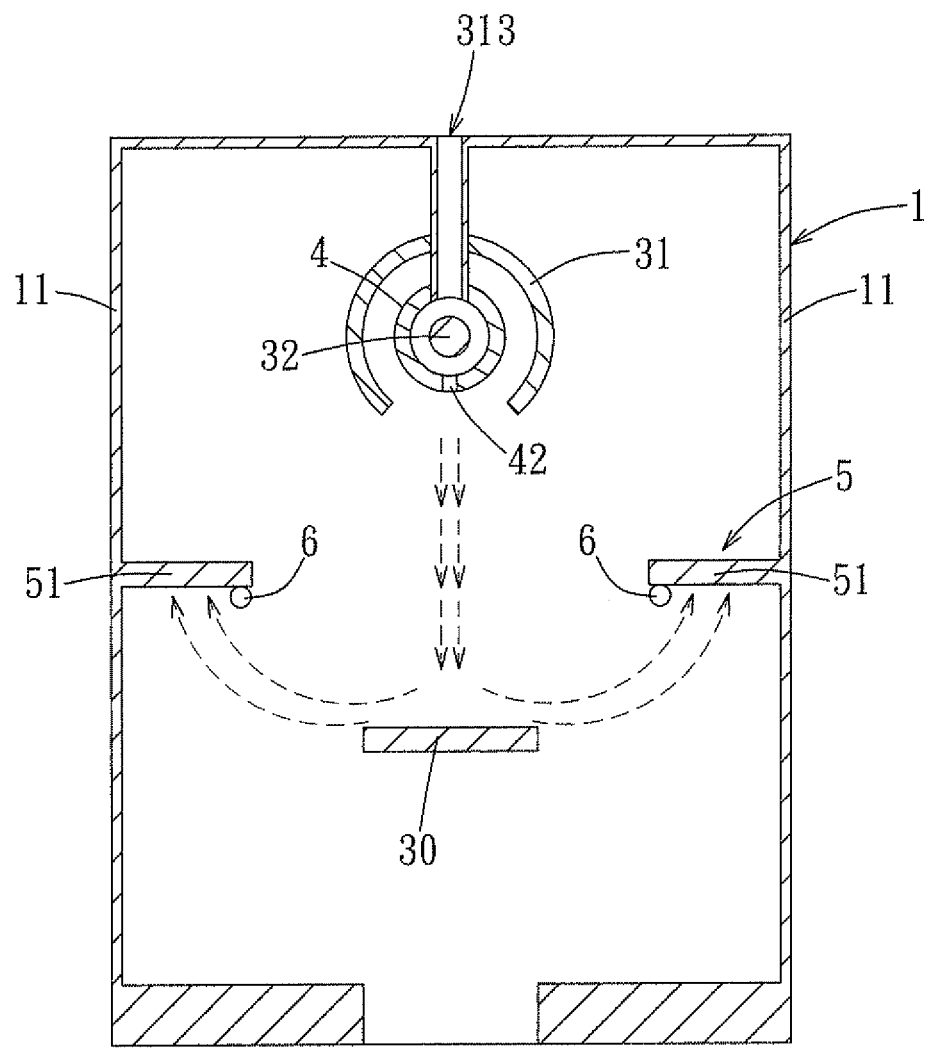
FIG. 5 illustrates a flow path of a plasma-inducing gas supplied from the gas supplying conduit according to the first preferred embodiment of this invention.

Referring to FIGS. 1, 2 and 5, a constant amount of the plasma-inducing gas from the gas source 40 is continuously introduced to the gas supplying conduit 4 by controlling the gas control valve 50. At the same time, the microwave from the magnetron source 20 is transmitted to the antenna unit 3 through the waveguide 2. In this preferred embodiment, the pressure inside the gas supplying conduit 4 is 760 torr, and the pressure outside the gas supplying conduit 4 is 120 torr. With the controlled pressure difference between the inside and outside of the gas supplying conduit 4 and the sizes arranged for the intake holes 41 and the exhaust holes 42, the plasma-inducing gas (argon) in the gas supplying conduit 4 can be blown out of the exhaust holes 42 toward the substrate 30 at a constant rate, and interacts with the microwave from the antenna unit 3 to produce the plasma. The traveling direction of the microwave and the plasma-inducing gas is shown by dotted lines in FIG. 5.

Besides, when the plasma-inducing gas is blown forcedly toward the substrate 30, it will create a flow jet onto the substrate 30 causing some flow currents to flow back to the gas supplying conduit 4. With the blocking unit 5, the plasma-inducing gas can be prevented from flowing back to the gas supplying conduit 4.

Referring to FIGS. 4 and 5, the microwave plasma deposition device 10 further includes two precursor supplying units 6 which are mounted respectively on bottom sides of the blocking plates 51 at locations proximate to midway between the sidewalls 11. Each of the precursor supplying units 6 includes a copper tube and a plurality of venting holes 61 for blowing a precursor toward the substrate 30. In this embodiment, the precursor includes silane ($SiH_4$). The silane will react with the plasma to release silicon ions used to form a silicon film on the substrate 30. Since the plasma-inducing gas can be prevented from flowing back to the gas supplying conduit 4 by virtue of the blocking plates 51, and since the precursor supplying units 6 are mounted on the bottom sides of the blocking plates 51, the silicon film is less susceptible to accumulate on the gas supplying conduit 4.

Figure 6:
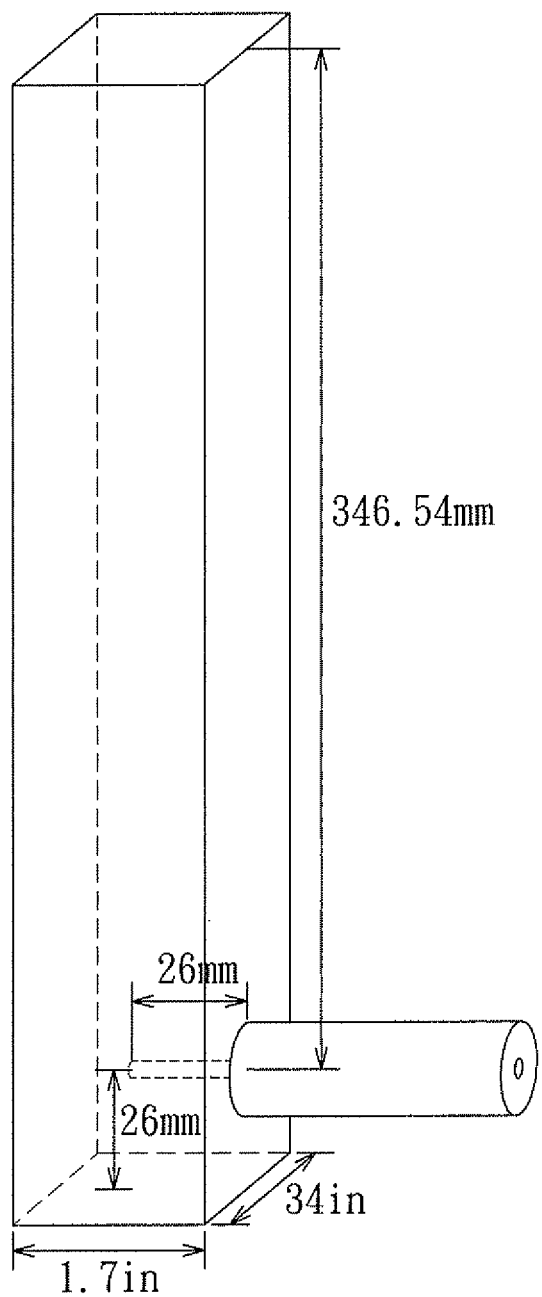
FIG. 6 illustrates dimensions of the waveguide and the antenna unit in the first preferred embodiment of this invention.

FIG. 6 illustrates dimensions of the waveguide 2 and the antenna unit 3 that are suitable for this invention. However, the dimensions should not be regarded as a limitation of the invention. It should be noted that, when a distance between a bottom end of the waveguide 2 and the inner conductor wire 32 is three-twentieth of a wavelength of the microwave, the transmission of the microwave is the most effective.

Figure 7:
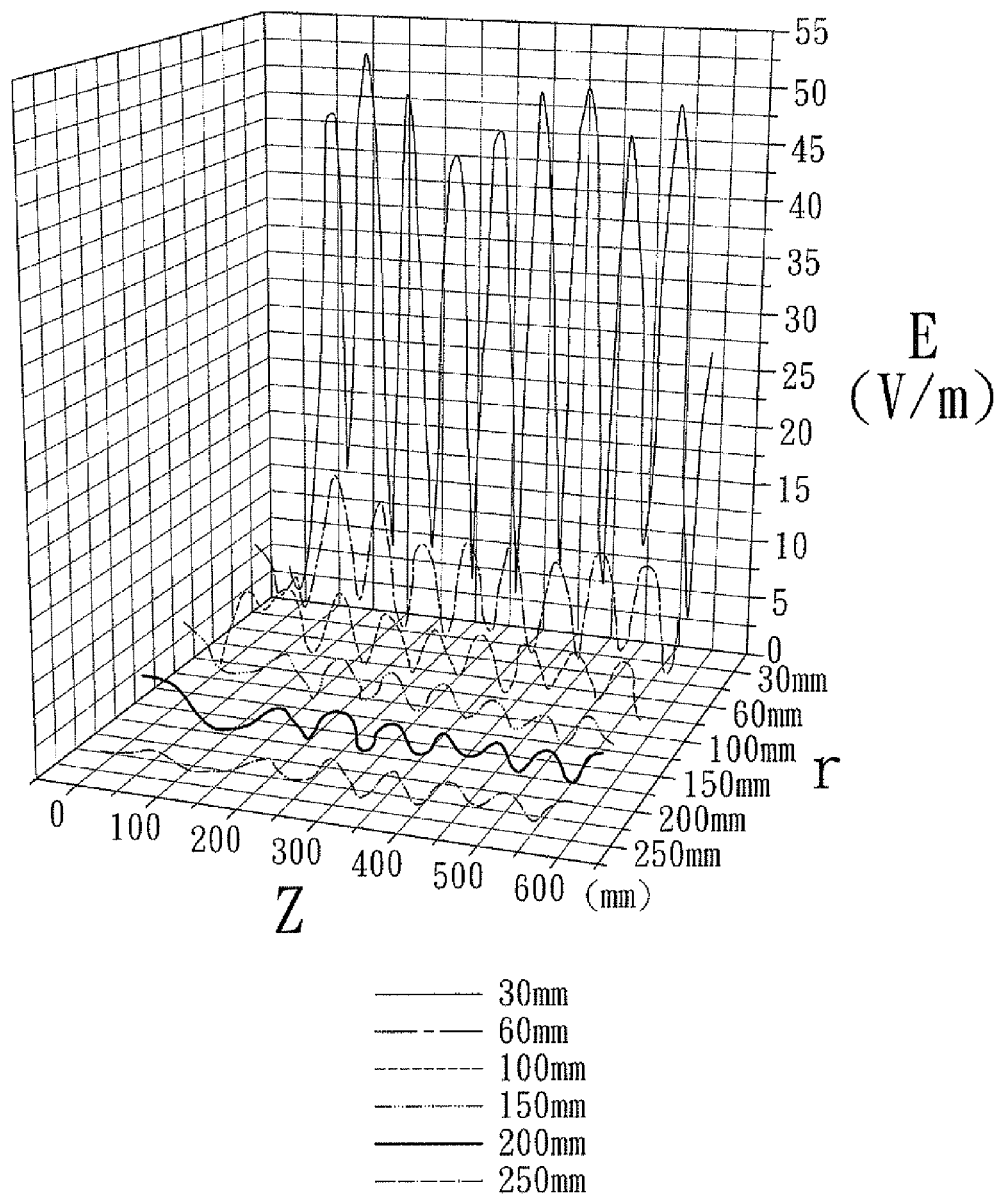
FIG. 7 illustrates simulation results for the plasma deposition device of the first preferred embodiment using parameters: R=15 mm, r=30-250 mm, and Z=0-600 mm.
Figure 8:
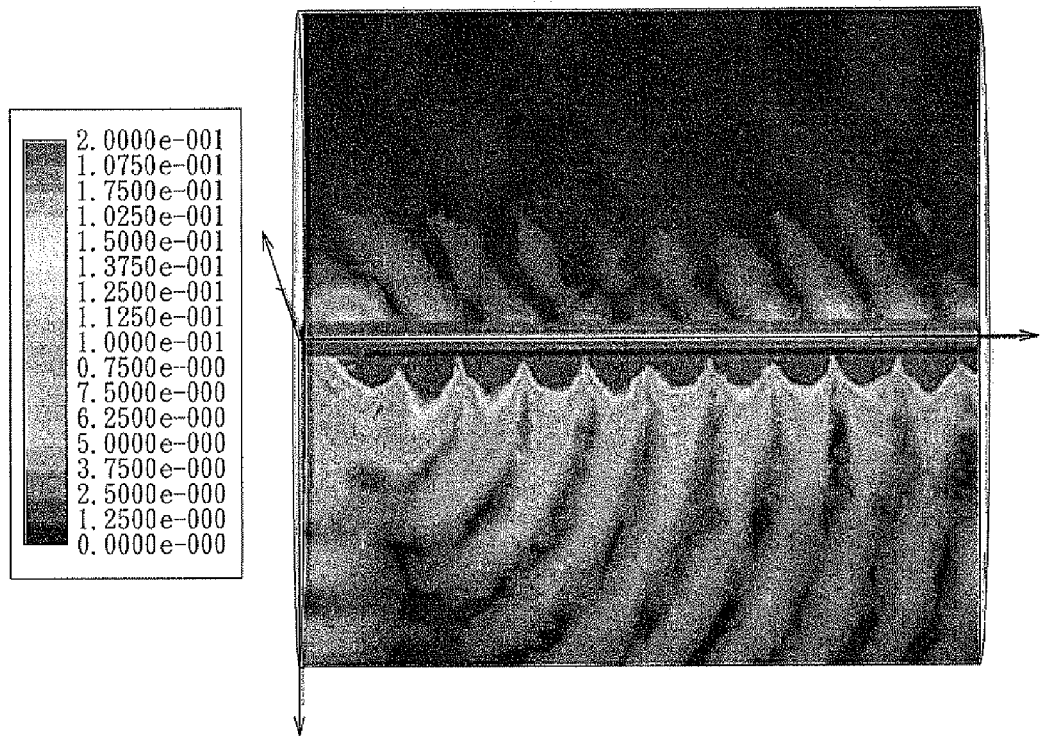
FIG. 8 is a radiation waveform simulation pattern illustrating the microwave transmitting from the inner conductor wire to the substrate, parameters for the simulation being the same as those described in FIG. 7.

FIG. 7 shows the results of simulations which were carried out for the microwave plasma deposition device 10 in which the wave-transmitting portion 312 has a radius (R) of 15 mm, and the opening 33 has an opening angle of 90 degrees. (Z) represents a distance in the wave-transmitting portion 312 from the connection portion 311 (0~600 mm). FIG. 8 shows a radiation waveform simulation pattern for the microwave transmitting from the inner conductor wire 32 to the substrate 30. It is noted that, when the shortest distance (r) between the inner conductor wire 32 and the substrate 30 is 250 mm, the electric field intensity (E) decreases to 1 V/m. FIG. 8 shows that the waveform is continuous, which indicates that the microwave is evenly transmitted to interact with the plasma-inducing gas and produce the plasma uniformly.

Figure 9:
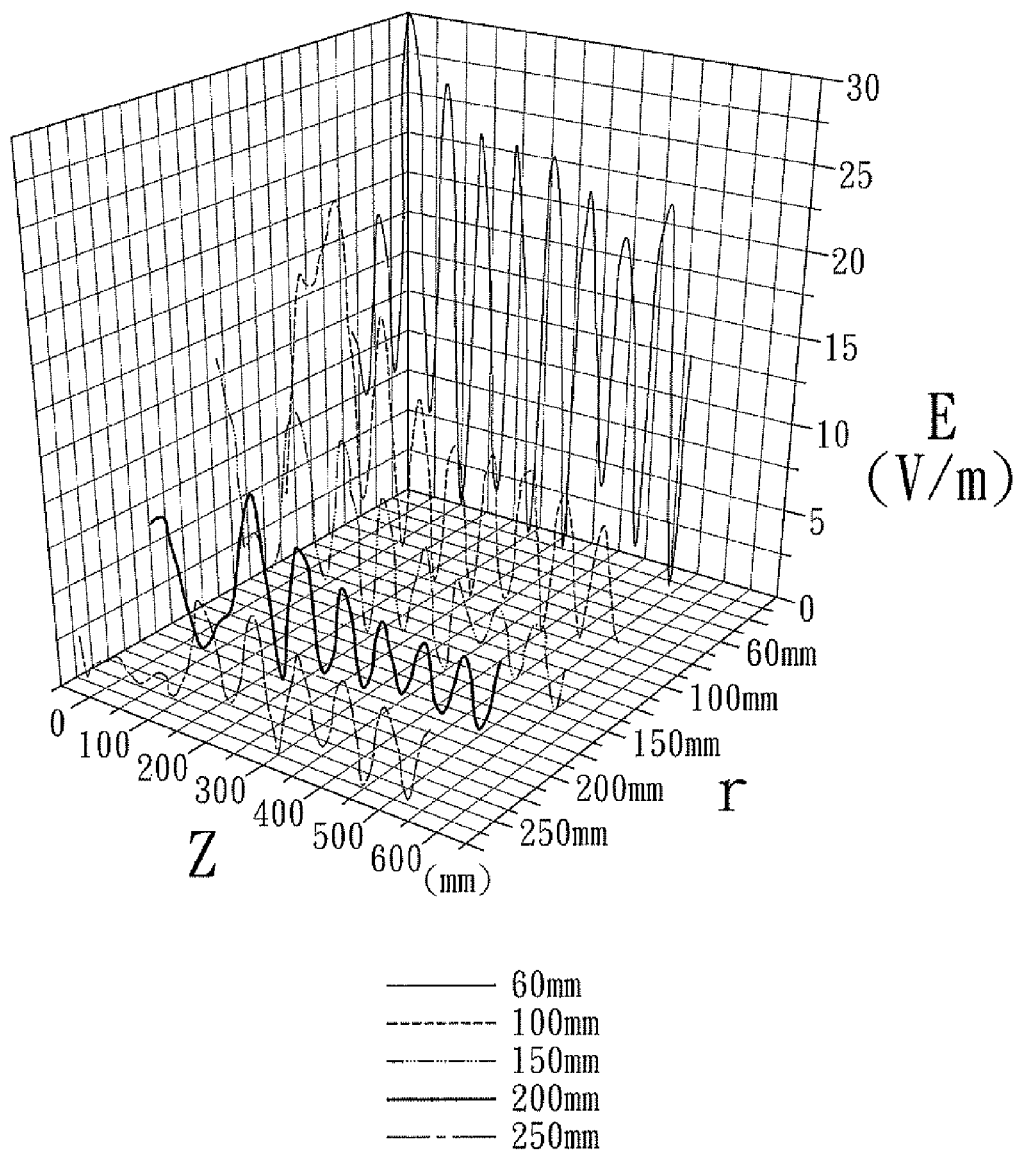
FIG. 9 illustrates simulation results for the plasma deposition device of the first preferred embodiment using parameters: R=30 mm, r=60-250 mm, and Z=0-600 mm.
Figure 10:
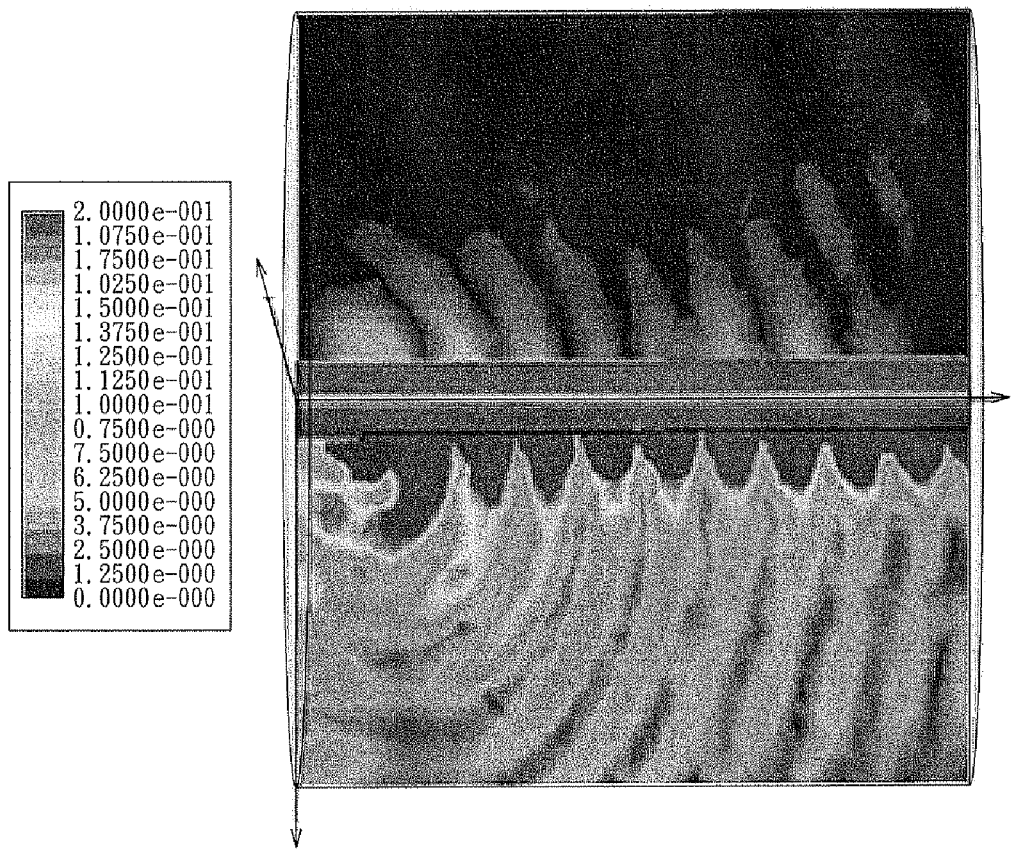
FIG. 10 is another radiation waveform simulation pattern that is obtained using the same parameters as those described in FIG. 9.

FIGS. 9 and 10 respectively show simulation results and a radiation waveform simulation pattern which were obtained when the radius (R) of the wave-transmitting portion 312 is 30 mm, and the opening angle is 90 degrees.

Figure 11:
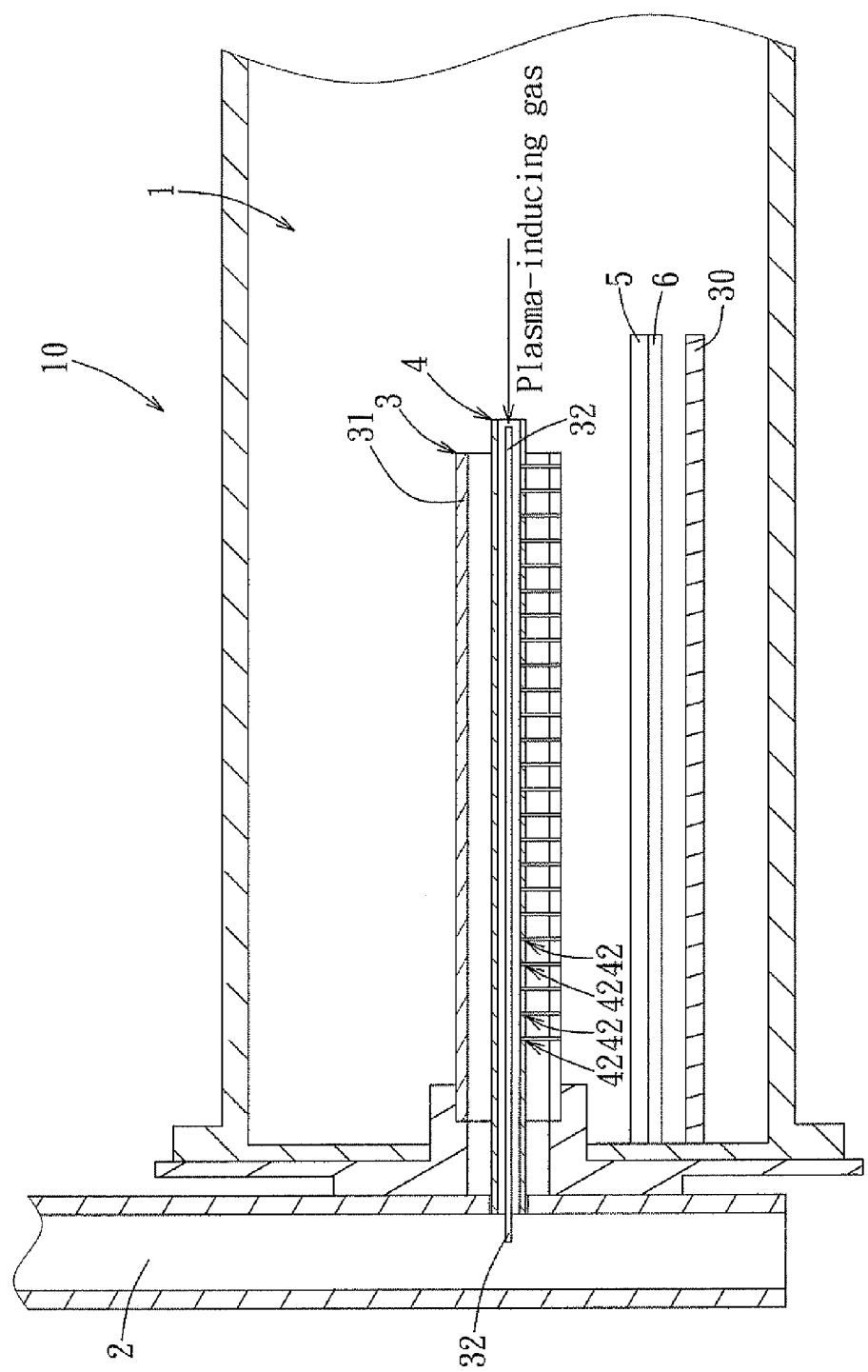
FIG. 11 is a cross-sectional view of the second preferred embodiment of the plasma deposition device according to this invention.

FIG. 11 shows the second preferred embodiment of the microwave plasma deposition device 10 according to this invention. The second preferred embodiment differs from the first preferred embodiment in that the plasma-inducing gas is introduced from one end 44 of the gas supplying conduit 4 opposite to the waveguide 2. Therefore, the bores 313 of the antenna unit 3 and the intake holes 41 of the gas supplying conduit 4, which are used in the first preferred embodiment, need not be formed in the second preferred embodiment. A predetermined amount of the plasma-inducing gas is introduced at a constant rate from the gas source 40 to the gas supplying conduit 4 by controlling the gas control valve 50. With the pressure difference between the inside and outside of the gas supplying conduit 4, the plasma-inducing gas (argon) in the gas supplying conduit 4 can be blown out of the exhaust holes 42 toward the substrate 30.

Figure 12:
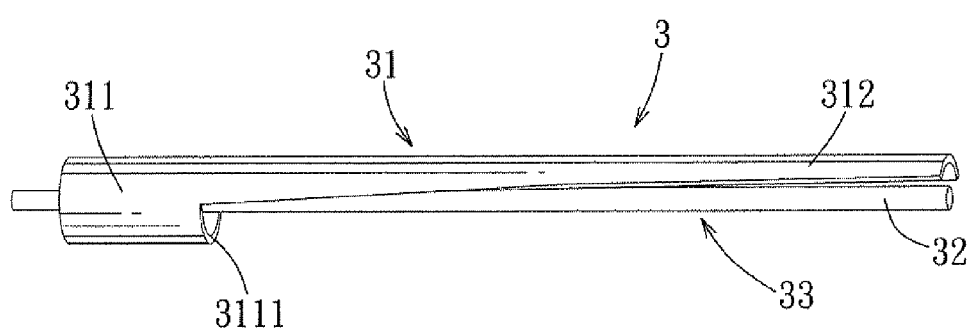
FIG. 12 is a schematic view of the antenna unit in the third preferred embodiment of the plasma deposition device according to this invention.

FIG. 12 illustrates the antenna unit 3 in the third preferred embodiment according to this invention. The third preferred embodiment differs from the first preferred embodiment in that the arc-shaped cross section of the wave-transmitting portion 312 of the outer conductor 31 is tapered from the one end 3111 of the connection portion 311 to a free end of the wave-transmitting portion 312. Therefore, the opening angle of the opening 33 increases with an increase of the distance from the connection portion 311. The antenna unit 3 of this embodiment can also emit the microwave to evenly interact with the plasma-inducing gas and to produce the plasma. It should be noted that, in this embodiment, the opening 33 is also symmetrical with respect to the line of shortest distance between the inner conductor wire 32 and the substrate 30.

Figure 13:
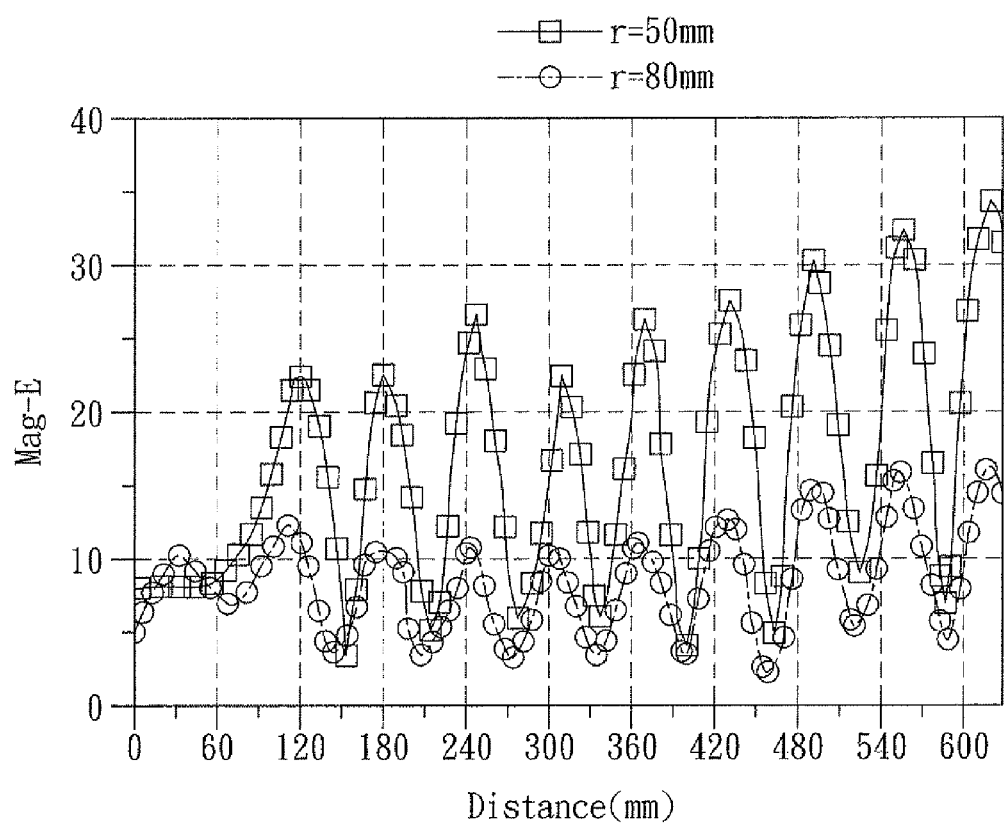
FIG. 13 illustrates the results of simulations carried out for the second preferred embodiment.

FIG. 13 shows plots of electric field distributions as a function of the distance of the wave-transmitting portion 312 from the connection portion 311, which were plotted for the second preferred embodiment and for the opening angle that varies from 90 degrees to 180 degrees. The shortest distances (r) between the inner conductor wire 32 and the substrate 30 for the two plots are 50 mm and 80 mm, respectively. The results in FIG. 13 show that the electric field intensity increases with an increase of the distance from the connection portion 311 (or with an increase of the opening angle).

Figure 14:
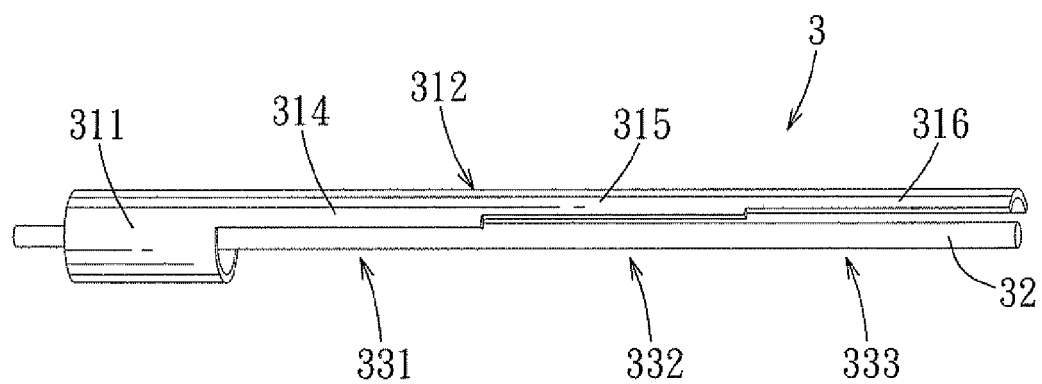
FIG. 14 is a schematic view of the antenna unit in the fourth preferred embodiment of the plasma deposition device according to this invention.

FIG. 14 illustrates the antenna unit 3 in the fourth preferred embodiment according to this invention. The fourth preferred embodiment differs from the first preferred embodiment in that the wave-transmitting portion 312 includes first, second and third sections 314, 315, 316. The first section 314 is proximate to the connection portion 311. The third section 316 is the farthest from the connection portion 311. The second section 315 is between the first and third sections 314, 316. The arc-shaped cross section of the wave-transmitting portion 312 decreases discretely in the order of the first, second and third sections 314, 315, 316. The first, second and third sections 314, 315, 316 respectively have the first, second and third openings 331, 332, 333, all of which open downward in the same direction as the exhaust holes 42 (also see FIG. 2). The antenna unit 3 of this embodiment can also emit the microwave to evenly interact with the plasma-inducing gas and produce the plasma. It should be noted that, in this embodiment, the first, second and third openings 331, 332, 333 are also symmetrical with respect to the line of shortest distance between the inner conductor wire 32 and the substrate 30.

Figure 15:
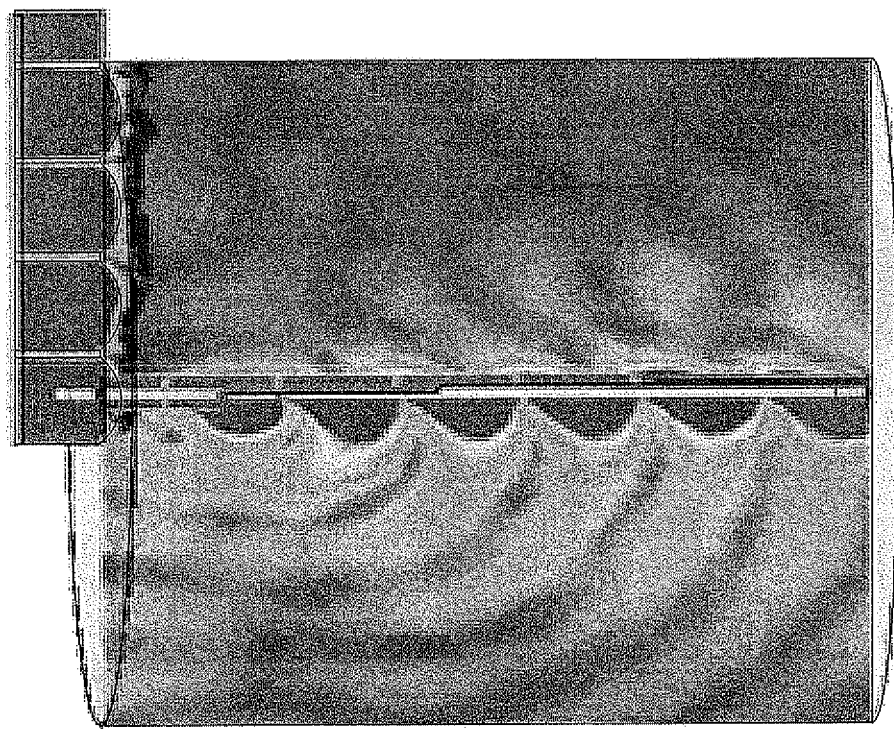
FIG. 15 is a radiation waveform simulation pattern obtained for the fourth preferred embodiment of this invention.

FIG. 15 shows a waveform pattern obtained for the microwave plasma deposition device 10 of the fourth preferred embodiment. The waveform pattern manifests that when the lengths of the connection portion 311, and the first, second and third sections 314, 315, 316 of the wave-transmitting portion 312 are 63 mm, 110 mm, 110 mm, and 110 mm, respectively, and when the opening angles of the first, second and third openings 331, 332, 333 are 195 degrees, 228 degrees, and 255 degrees, respectively, the transmission of the microwave is excellent and no reflection of the microwave occurs.

In summary, with the pressure difference between the inside and outside of the gas supplying conduit 4, the plasma-inducing gas can be blown toward the substrate 30 at a constant rate. With the arc-shaped cross section of the wave-transmitting portion 312, the microwave can be evenly transmitted to interact with the plasma-inducing gas and produce the plasma. Besides, by virtue of the design of the blocking unit 5 and the precursor supplying units 6, accumulation of the plasma ions on the gas supplying conduit 4 can be prevented, and a lifetime of the gas supplying conduit 4 can be prolonged.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A plasma deposition device for coating a substrate, comprising:
   a vacuum chamber;
   a waveguide disposed in said vacuum chamber for transmitting a microwave;
   an antenna unit disposed in said vacuum chamber above the substrate for receiving the microwave from said waveguide, and connected to said waveguide said antenna unit including an outer conductor and an inner conductor wire that is disposed inside said outer conductor;
   a gas supplying conduit disposed inside said outer conductor and surrounding said inner conductor wire, and including a plurality of exhaust holes for blowing a plasma-inducing gas downward and toward the substrate to interact with the microwave and to produce plasma; and
   a blocking unit disposed in said vacuum chamber to prevent the plasma-inducing gas blown to the substrate from flowing back to said gas supplying conduit.

2. The plasma deposition device of claim 1, wherein said vacuum chamber has two opposite sidewalls, said gas supplying conduit being located between said sidewalls and above the substrate, said blocking unit including two blocking plates mounted respectively on said sidewalls below said gas supplying conduit and above the substrate and located on two sides of a downward flowing path of the plasma.

3. The plasma deposition device of claim 1, wherein said outer conductor includes a connection portion connected to said waveguide, and a wave-transmitting portion extending from one end of said connection portion opposite to said waveguide, said wave-transmitting portion having an arc-shaped cross section, and an opening that opens downward in the same direction as said exhaust holes and that is as long as said wave-transmitting portion.

4. The plasma deposition device of claim 2, further comprising two precursor supplying units which are mounted respectively on bottom sides of said blocking plates at locations proximate to the flowing path of the plasma.

5. The plasma deposition device of claim 3, wherein said arc-shaped cross section of said wave-transmitting portion has a constant dimension.

6. The plasma deposition device of claim 3, wherein said arc-shaped cross section of said wave-transmitting portion is tapered from said one end of said connection portion to a free end of said wave-transmitting portion.

7. The plasma deposition device of claim 3, wherein said wave-transmitting portion includes first, second and third sections, said first section being proximate to said connection portion, said third section being the farthest from said connection portion, said second section being between said first and third sections, a dimension of said arc-shaped cross section of said wave-transmitting portion decreasing discretely in the order of said first, second and third sections.

8. The plasma deposition device of claim 3, wherein said opening is symmetrical with respect to a line of shortest distance between said inner conductor wire and the substrate.

* * * * *